United States Patent
Lu

(10) Patent No.: US 9,697,893 B2
(45) Date of Patent: Jul. 4, 2017

(54) DRIVING CIRCUIT WITH ADJUSTABLE TERMINATION RESISTOR

(71) Applicant: Nuvoton Technology Corporation, Hsinchu Science Park (TW)

(72) Inventor: Chia-Ching Lu, Hsinchu (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 0 days.

(21) Appl. No.: 15/156,921

(22) Filed: May 17, 2016

(65) Prior Publication Data
US 2017/0062047 A1    Mar. 2, 2017

(30) Foreign Application Priority Data
Aug. 27, 2015    (TW) .............................. 104128071 A

(51) Int. Cl.
G11C 11/00    (2006.01)
G11C 13/00    (2006.01)
H01L 45/00    (2006.01)

(52) U.S. Cl.
CPC ...... *G11C 13/0021* (2013.01); *G11C 13/0007* (2013.01); *H01L 45/1206* (2013.01); *G11C 2013/0045* (2013.01); *G11C 2013/0078* (2013.01); *G11C 2213/79* (2013.01)

(58) Field of Classification Search
CPC ............ G11C 13/0021; G11C 13/0007; G11C 2013/0078; G11C 2213/79; G11C 2013/0045; H01L 45/1206
USPC ........................................................ 365/148
See application file for complete search history.

(56) References Cited

U.S. PATENT DOCUMENTS

| 6,766,404 B1* | 7/2004 | Osaka ................. G06F 13/4077 710/306 |
| 8,553,471 B2 | 10/2013 | Kim et al. |
| 2004/0128601 A1* | 7/2004 | Muljono .......... G01R 31/31716 714/734 |
| 2012/0019282 A1 | 1/2012 | Millar |
| 2013/0182513 A1 | 7/2013 | Eom et al. |
| 2014/0016404 A1 | 1/2014 | Kim et al. |
| 2014/0062528 A1 | 3/2014 | Park |
| 2014/0286110 A1 | 9/2014 | Shimizu et al. |

(Continued)

FOREIGN PATENT DOCUMENTS

TW    201349236 A    12/2013

OTHER PUBLICATIONS

An Office Action from corresponding Taiwanese Application No. 104128071 mailed Jan. 13, 2017; 5 pgs.

*Primary Examiner* — Tha-O H Bui
(74) *Attorney, Agent, or Firm* — Muncy, Geissler, Olds & Lowe, P.C.

(57) ABSTRACT

An embodiment of a driving circuit is provided. The driving circuit is coupled to an I/O pad. The driving circuit includes an output driver, a first termination resistor, a second termination resistor and a monitoring circuit. The output driver outputs an output data via the I/O pad. The first termination resistor and the second termination resistor are coupled to a node between the output driver and the I/O pad. The monitoring circuit monitors a first current passing through the first termination resistor and adjusts resistance of the first termination resistor and the second termination resistor according to the first current.

7 Claims, 8 Drawing Sheets

(56) References Cited

U.S. PATENT DOCUMENTS

2014/0372791 A1* 12/2014 Adachi .............. G06F 13/1689
                                                          714/5.1
2015/0008956 A1    1/2015 Millar

* cited by examiner

DRIVING CIRCUIT WITH ADJUSTABLE TERMINATION RESISTOR

CROSS REFERENCE TO RELATED APPLICATIONS

This Application claims priority of Taiwan Patent Application No. 104128071, filed on Aug. 27, 2015, the entirety of which is incorporated by reference herein.

BACKGROUND OF THE INVENTION

Field of the Invention

The present disclosure relates to a driving circuit, and more particularly to a driving circuit with adjustable termination resistor.

Description of the Related Art

During the recent years, the mobile personal electronic devices become more popular. The wide use of the smart phones, digital cameras, notebooks and other consumer products increases a demand for memory having low power consumption and long storage time. The demand for non-volatile memory is increased accordingly. The major feature of the non-volatile memory is that the content stored by the non-volatile memory would not disappear even under the power failure situation. Similar to a hard drive, the non-volatile memory is can be used as a reliable storage device.

The resistive memory is made of a transistor and a memory element (that is, the 1T1R type), wherein the resistance of the memory element can be changed by applied voltage or applied current. The structure of the memory element is a metal-insulator-metal (MIM) element, and the MIM element can be made by materials of perovskite oxides and transition metal oxides. The resistance of the insulator can be changed by applying different voltages to the insulator having the feature of variable resistance, so as to write data in the memory element or erase the memory element. Different resistances of the memory element indicate different data. When reading data stored in the memory element, a small bias voltage is applied and reads the current passing through the memory element to determine the logic data stored therein.

When the operation speed of the electronic devices becomes faster, frequency of interface signal between the memory device and the controller is increased to reduce the latency during signal transmission. Therefore, the signal transmission is affected by external noise more easily and a reflected signal may be generated and transmitted back to the memory device, which may cause failure of accessing the memory device. To avoid the effect caused by the reflected signal, the termination resistor is applied to absorb the reflected signal to reduce possible signal interference or noise.

Moreover, the bus transmission interface used with the personal computer or electronic device has a high transmission speed. An example of the bus transmission interface includes a universal serial bus (USB), a PCI Express (PCIe) interface, and a serial advanced technology attachment (SATA) bus. Thus, in a high-speed transceiver, the termination resistor is used for the impedance match on the transmission line to avoid the signal distortion and return loss caused by the impedance mismatch.

BRIEF SUMMARY OF THE INVENTION

An embodiment of the present disclosure provides a driving circuit coupled to an I/O pad. The driving circuit comprises an output driver, a first termination resistor, a second termination resistor and a monitoring circuit. The output driver is configured to output output data via the I/O pad. The first termination resistor and the second termination resistor are coupled to a node between the output driver and the I/O pad. The monitoring circuit is configured to monitor a first current passing through the first termination resistor and adjust resistances of the first termination resistor and the second termination resistor according to the first current.

In one embodiment of the present disclosure, each of the first termination resistor and the second termination resistor comprises a resistor with a constant resistance and a resistive memory.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Typically speaking, the termination resistor is an external resistor with constant resistance. To avoid impedance mismatch caused by the resistance of the termination resistor, a design for the termination resistor with adaptive adjustable resistance is desirable.

Since the resistance of the resistive memory (RRAM) can be adjusted according to an applied voltage pulse or current pulse, the RRAM in the present disclosure is used to implement the termination resistor with an adjustable resistance.

Figure 1:
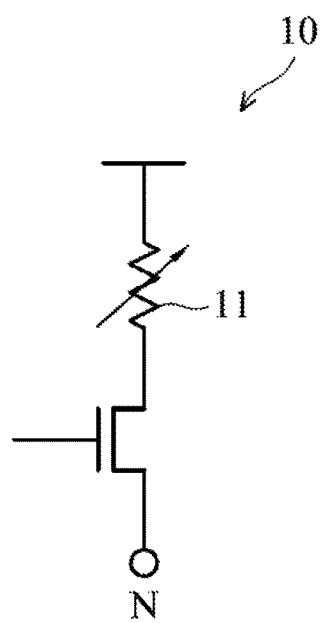
FIG. 1 is a schematic diagram showing a RRAM (resistive random access memory) cell.

FIG. 1 is a schematic diagram of a memory cell of RRAM. A memory cell 10 comprises a transistor T1 and a metal-insulator-metal (MIM) element 11. The resistance of the MIM element 11 can be changed accordingly with a bias voltage applied on the node N. During read operation of the memory cell 10, a read voltage is applied to the MIM element via a bit line, and the logic state of the data stored in the memory cell 10 is determined based on a current passing through the MIM element. However, if the resistance variation range is not great enough, the current difference between data states is not easily determined, thus, the data states may be incorrectly determined.

Figure 2:
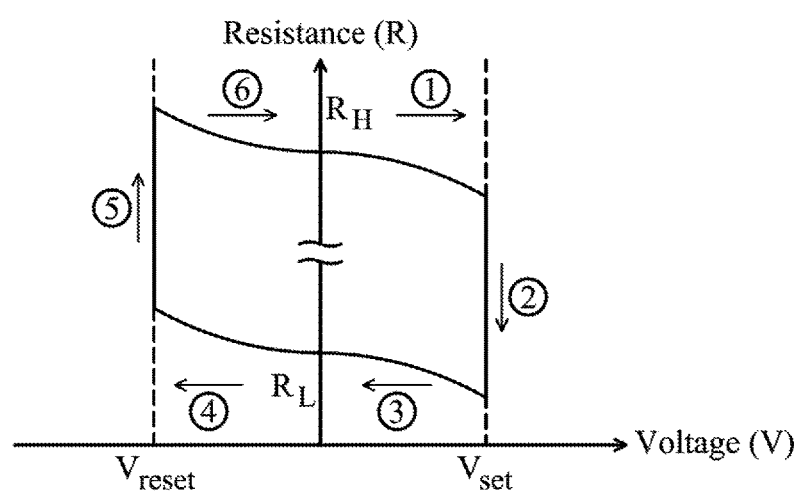
FIG. 2 is a voltage versus resistance graph of a bipolar resistive memory.

FIG. 2 is a voltage versus resistance graph of a bipolar resistive memory. In this embodiment, the magnitude of the set voltage $V_{set}$ and the magnitude of the reset voltage $V_{reset}$ are the same, but the voltage directions are different from each other. When the voltage direction of applied voltage is the same as that of the set voltage $V_{set}$ and the applied voltage is increased from 0, the variation of the resistance of the resistive memory is shown as the arrow 1. When the magnitude of the applied voltage is greater than that of the set voltage $V_{set}$, the variation of the resistance of the resistive memory is shown as the arrow 2, and the resistance of the resistive memory is changed from a high resistance $R_H$ to a low resistance $R_L$. In this case, even if the set voltage $V_{set}$ is decreased to 0, the resistance of the resistive memory is maintained at the low resistance $R_L$ (shown as the arrow 3). If a reverse voltage is applied to the resistive memory, the variation of the resistance of the resistive memory is shown as the arrow 4. The resistance of the resistive memory is maintained at the low resistance $R_L$ until the applied voltage is greater than the reset voltage $V_{reset}$. When the applied voltage is greater than the reset voltage $V_{reset}$, the variation of the resistance of the resistive memory is shown the as arrow 5, and the resistance of the resistive memory is changed from the low resistance $R_L$ to the high resistance $R_H$. In this case, even if the applied voltage is decreased, the resistance of the resistive memory is maintained at the high resistance $R_H$ (shown as the arrow 6).

From the description of FIG. 2, the variation of the resistance of the bipolar resistive memory is related to the voltage variation. Although FIG. 2 is illustrated with the bipolar resistive memory, the single polar resistive memory has the similar characteristic. According to the description of FIG. 2, the specific characteristic can be used for the termination resistor to design a termination resistor with adjustable resistance.

The termination resistor is usually disposed on a mainboard of a computer or an electronic device. When the processor transmits signals to the memory or memory blocks under operating, the signals may also be transmitted to the standby memory. Then, the standby memory generates and transmits a reflective signal to the memory under operating, and it causes signal interference. To avoid the issue, a memory with embedded termination resistor is one solution.

Furthermore, the driving circuit of the memory is generally external to the memory, and the signal may have a distorted waveform due to the signal transmission. In the present disclosure, an off-chip driver (OCD) circuit is used to solve the issue. The off-chip driver circuit is configured to adjust voltage of the I/O driving circuit, compensate pull-up impedance or pull-down impedance, and reduce signal drift of the signals DQ and DQS, so as to improve the signal integrity.

Figure 3:
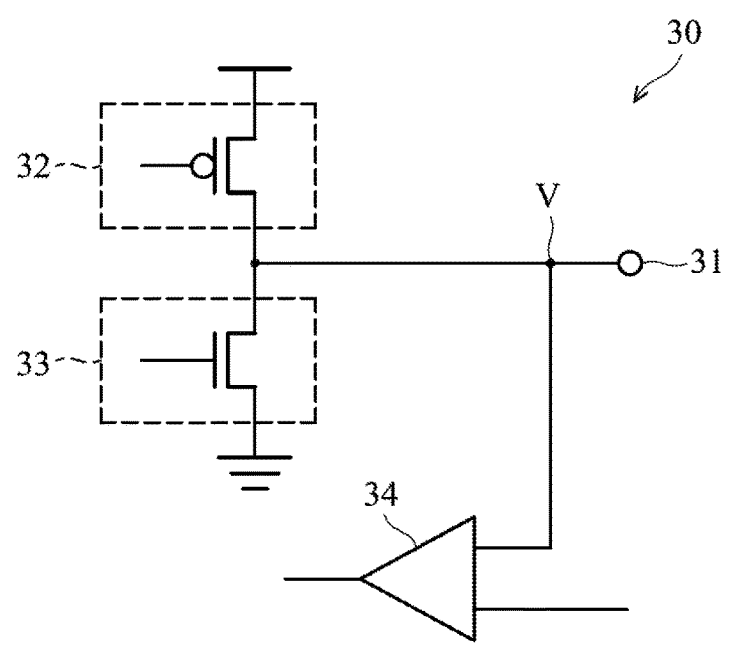
FIG. 3 is a schematic diagram of an off-chip driver circuit.

FIG. 3 is a schematic diagram of an off-chip driver circuit. As shown in FIG. 3, the off-chip driver circuit 30 includes a pull-up driver (PU) 32 which includes a P-type FET coupled to VCC, and a pull-down driver (PD) 33 which includes an N-type FET coupled between the ground and the pull-up driver 32. An output voltage V exists on a node between the PU 32 and the PD 33, and is applied to the buffer 34 and the contact pad 31.

Figure 4:
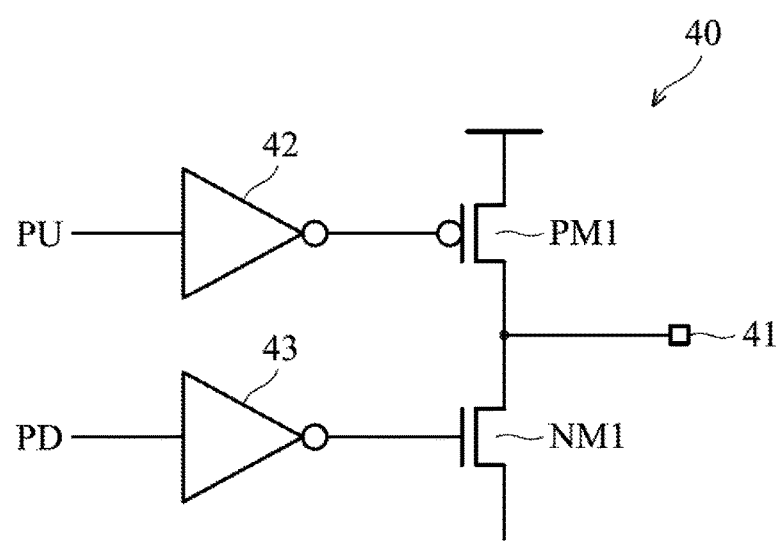
FIG. 4 is a schematic diagram of another off-chip driver circuit.

FIG. 4 is a schematic of another off-chip driver circuit. The off-chip driver circuit 40 is coupled to the I/O pad 41. The off-chip driver circuit 40 comprises a PMOS transistor PM1, a NMOS transistor NM1, an inverter 42 and an inverter 43. Driving signals PU and PD are transmitted to the PMOS transistor PM1 and the NMOS transistor NM1 via the inverter 42 and 43, respectively. The signal DQS of the I/O pad 41 is pulled up to the voltage VDDQ by applying the driving signal PU to the inventor 42 or is pulled down to the ground by applying the driving signals PD to the inventor 43.

Figure 5:
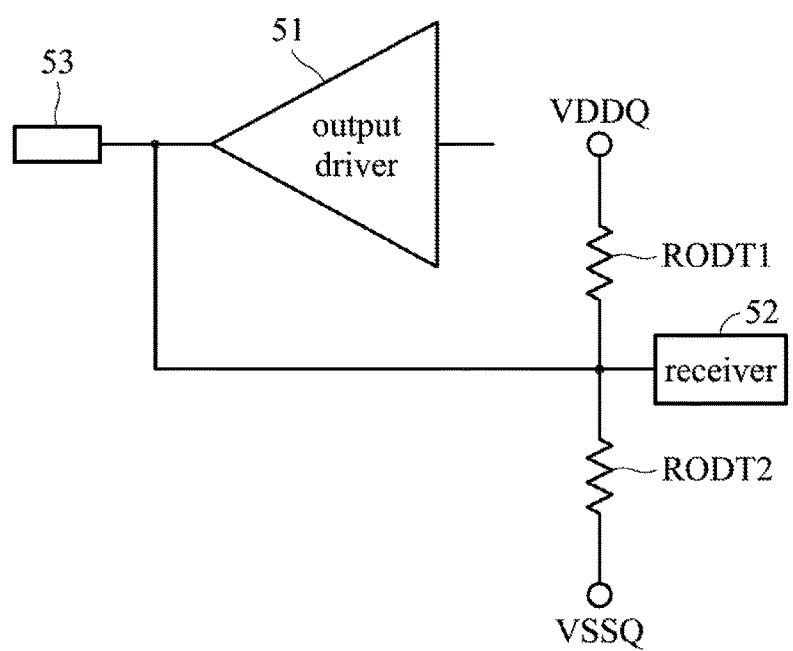
FIG. 5 is a schematic diagram of a driving circuit with a termination resistor.

FIG. 5 is a schematic diagram of a driving circuit with a termination resistor. In this embodiment, the driving circuit is a driving circuit of an I/O port of a memory module. The driving circuit includes an output driver 51, a receiver 52, an I/O pad 53, a first termination resistor RODT1 and a second termination resistor RODT2. In one embodiment, the output driver 51 may be implemented by the off-chip driver circuit shown in FIG. 3 or FIG. 4.

The output driver 51 is coupled to the I/O pad 53 to output data. The I/O pad 53 is also coupled to the receiver 52 to receive input data. The first termination resistor RODT1 and the second termination resistor RODT2 are serially connected between the voltage VDDQ and the voltage VSSQ. The resistances of the first termination resistor RODT1 and the second termination resistor RODT2 are determined based on the electrical characteristic of the driving circuit. In this embodiment, the resistances of the first termination resistor RODT1 and the second termination resistor RODT2 are set when the electronic device is turned on or is shipped, and can not be adjusted.

Figure 6:
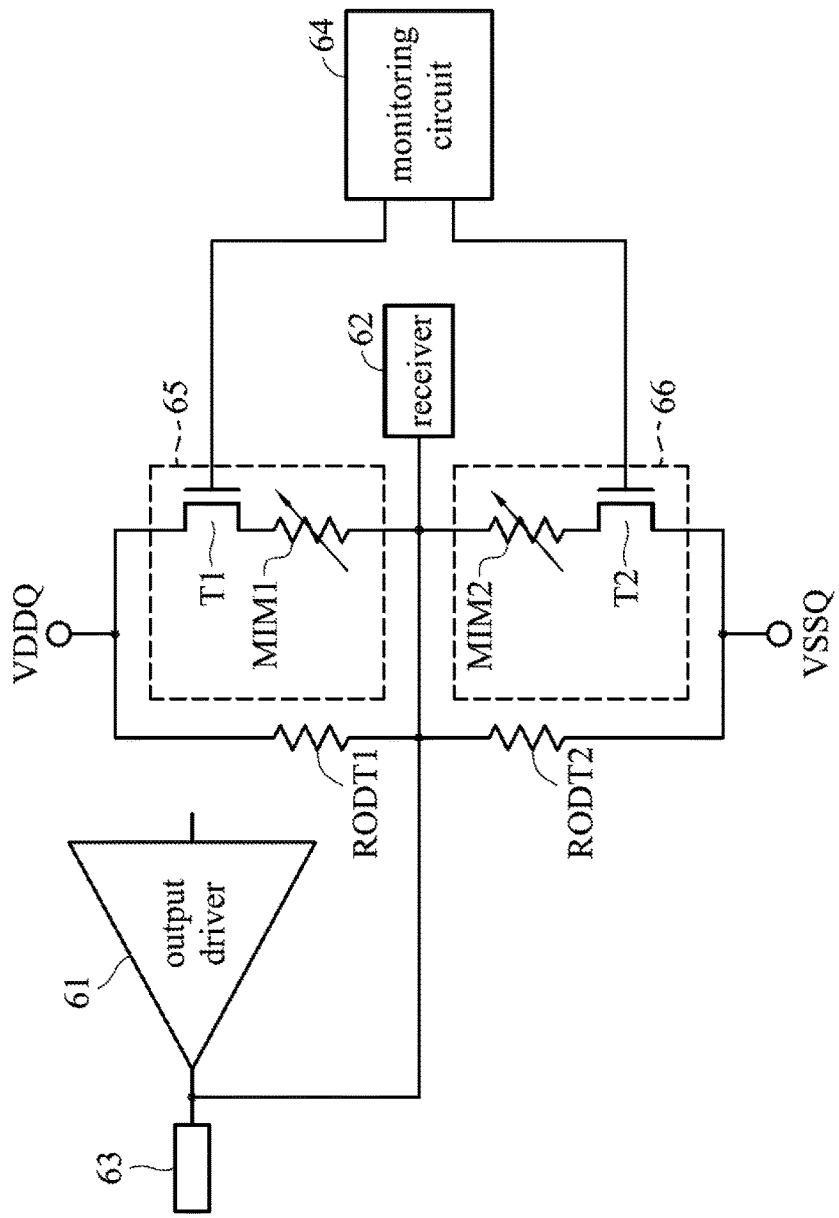
FIG. 6 is a schematic diagram of a driving circuit with an adjustable termination resistor according to an embodiment of the present disclosure.

FIG. 6 is a schematic diagram of a driving circuit with an adjustable termination resistor according to an embodiment of the present disclosure. In this embodiment, the driving circuit is a driving circuit of an I/O port of a memory module, but the present disclosure is not limited thereto. The driving circuit can be applied to any data transmission circuit or interface driving circuit. The driving circuit includes an output driver 61, a receiver 62, an I/O pad 63, a first termination resistor RODT1, a second termination resistor RODT2, a monitoring circuit 64, a first resistive memory 65 and a second resistive memory 66. In one embodiment, the output driver 61 can be implemented by the off-chip driver circuit shown in FIG. 3 or FIG. 4.

The output driver 61 is coupled to the I/O pad 63 to output data. The I/O pad 63 is also coupled to the receiver 62 to receive input data. The first termination resistor RODT1 and the second termination resistor RODT2 are serially connected between the voltage VDDQ and the voltage VSSQ. The resistances of the first termination resistor RODT1 and the second termination resistor RODT2 are determined based on the electrical characteristic of the driving circuit. In this embodiment, the resistances of the first termination resistor RODT1 and the second termination resistor RODT2 are set when the electronic device is turned on or is shipped, and can not be adjusted. Therefore, the first resistive memory 65 is connected to the first termination resistor RODT1 in parallel and the second resistive memory 66 is connected to the second termination resistor RODT2 in parallel in this embodiment. The monitoring circuit 64 is configured to adjust the resistances of the first resistive memory 65 and the second resistive memory 66.

In this embodiment, the first resistive memory 65 and the first termination resistor RODT1 form a first equivalent termination resistor, and the second resistive memory 66 and the second termination resistor RODT2 form a second equivalent termination resistor. The monitoring circuit 64 monitors the current passing through the first termination resistor RODT1 to adjust the resistance of the first resistive memory 65 and the resistance of the second resistive memory 66 according to the current. In this embodiment, the monitoring circuit 64 controls turn-on duration and conductivities of the first transistor T1 and the second transistor T2 to adjust the resistances of the memory elements MIM1 and MIM2.

Figure 7:
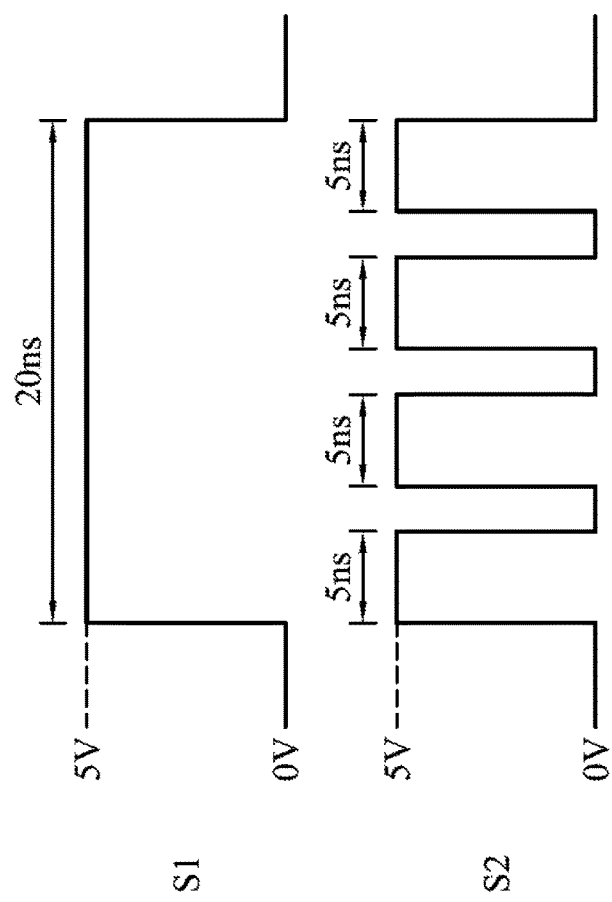
FIG. 7 is a schematic diagram of a control signal of a resistive memory according to an embodiment of the present disclosure.

As described above, the resistive memory changes its resistance according to the received voltage pulses or current pulses, so the duration of applied voltage pulse must be greater than a predetermined duration. Please refer to FIG. 7. FIG. 7 is a schematic diagram of a control signal of the resistive memory according to an embodiment of the present disclosure. Note that the embodiment is not limited the present disclosure therein. The control signal S1 is a voltage pulse for switching the resistive memory from L-state to H-state. The resistance change of the resistive memory is shown as the arrow 1 in FIG. 2. Since the duration of the applied voltage pulse requires at least 20 ns, the control signal S1 can be implemented by the control signal S2 having four voltage pulses. Each voltage pulse of the control signal S2 can slightly change the resistance of the resistive memory. Thus, the monitoring circuit 64 can control the transistors T1 and T2 by the control signal S2 to adjust the resistances of the resistive memories. In other words, the control signal output by the monitoring circuit 64 comprises a plurality of voltage pulses, and the resistances of the resistive memory elements can be adjusted according to the number of voltage pulses received by the transistor.

Figure 8:
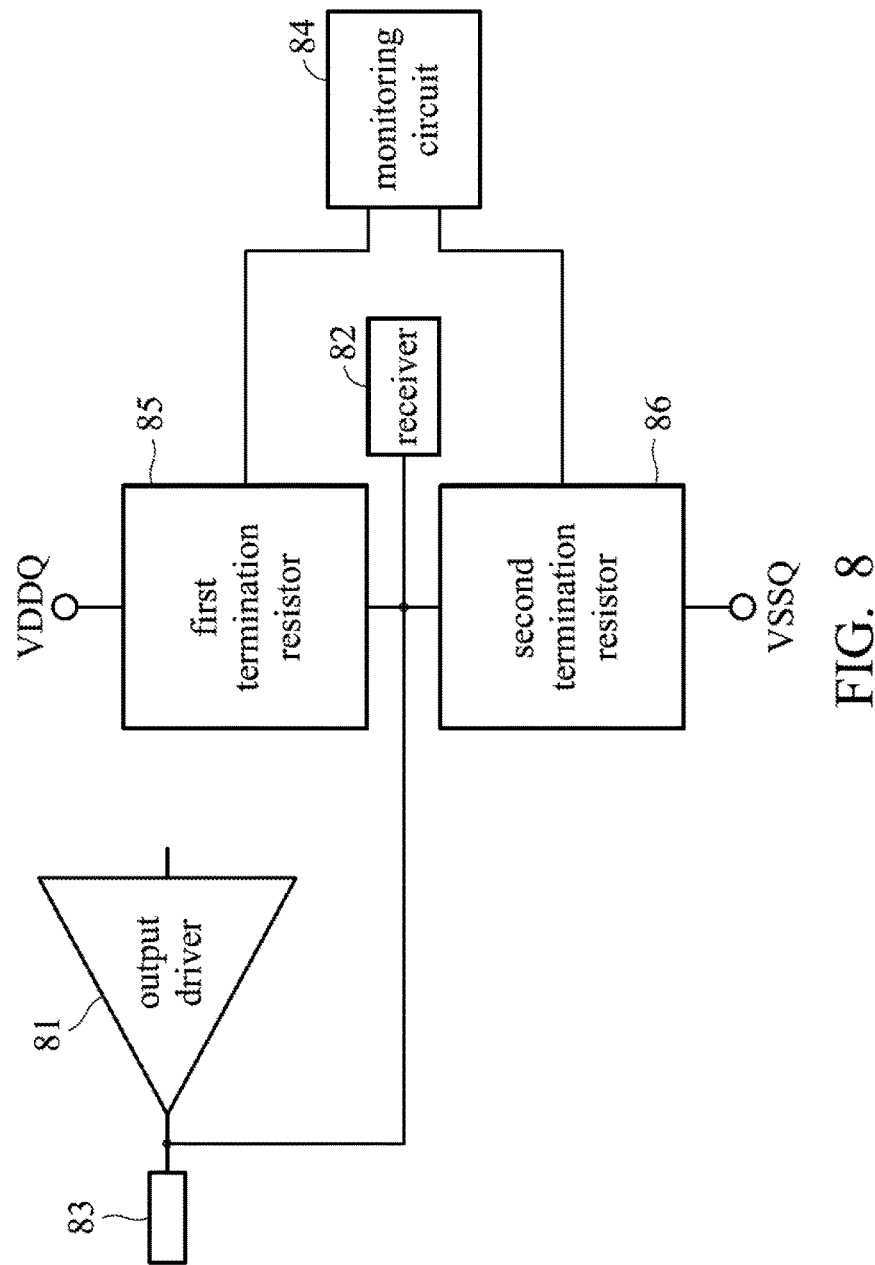
FIG. 8 is a schematic diagram of a driving circuit with an adjustable termination resistor according to another embodiment of the present disclosure.

FIG. 8 is a schematic diagram of a driving circuit with an adjustable termination resistor according to an embodiment of the present disclosure. In this embodiment, the driving circuit is a driving circuit of an I/O port of a memory module, but the present disclosure is not limited thereto. The driving circuit can be applied to any data transmission circuit or interface driving circuit. The driving circuit includes an output driver 81, a receiver 82, an I/O pad 83, a first termination resistor 85, a second termination resistor 86, and a monitoring circuit 84. In one embodiment, the output driver 81 can be implemented by the off-chip driver circuit shown in FIG. 3 or FIG. 4.

The output driver 81 is coupled to the I/O pad 83 to output data. The I/O pad 83 is also coupled to the receiver 82 to receive input data. The monitoring circuit 84 monitors a first current passing through the first termination resistor 85 to adjust the resistance of the first termination resistor 85 and the resistance of the second termination resistor 86 according to the first current. In this embodiment, the first termination resistor 85 comprises a resistor with constant resistance and a resistive memory element, such as the first resistive memory 65 or the second resistive memory 66 in FIG. 6. The monitoring circuit 84 adjusts the resistance of the resistive memory element by the control signal. Similarly, the second termination resistor 86 has a structure similar to that of the first termination resistor 85, and the monitoring circuit 84 can change the resistance of the second termination resistor 86.

In the present disclosure, the adjustable resistance of the resistive memory is used to achieve a function of a conventional variable resistor, but the conventional variable resistor is not covered by the present disclosure. Furthermore, the resistance of the conventional variable resistor is adjusted only manually or by an additional controller. In the traditional adjusting mechanism, the controller has to receive the control signal corresponding to a resistance first, and then adjust the resistance of the variable resistor according to the control signal. In another condition, the controller has to sense the magnitude of the current passing through the variable resistor first, and then adjusts the resistance of the variable resistor according to the magnitude of the current. In the present disclosure, the characteristic of the resistive memory is used to adjust the resistance of the resistive memory by changing the current passing through the resistive memory. The resistance of the traditional variable resistor cannot be adjusted by changing the current passing through the variable resistor.

While the present disclosure has been described by way of example and in terms of the preferred embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit coupled to an I/O pad, comprising:
an output driver configured to output data via the I/O pad;
a first termination resistor;
a second termination resistor, wherein first termination resistor and the second termination resistor are coupled to a node between the output driver and the I/O pad; and
a monitoring circuit configured to monitor a first current passing through the first termination resistor and adjust resistances of the first termination resistor and the second termination resistor according to the first current;
wherein at least one of the first termination resistor and the second termination resistor comprises a resistor with a fixed resistance and a resistive memory which is coupled to the resistor in parallel.

2. The driving circuit as claimed in claim 1, wherein the resistive memory comprises a resistive memory element and a transistor, and the monitoring circuit transmits a control signal to the transistor to adjust resistance of the resistive memory element.

3. The driving circuit as claimed in claim 2, wherein the control signal comprises a plurality of voltage pulse signals, and the resistance of the resistive memory element is changed according to the number of received voltage pulse signals.

4. The driving circuit as claimed in claim 2, wherein the resistive memory element is a metal-insulator-metal element.

5. The driving circuit as claimed in claim 1, further comprising a receiver coupled to the node to receive input data via the I/O pad.

6. The driving circuit as claimed in claim 1, wherein the output driver is an off-chip driver circuit.

7. The driving circuit as claimed in claim 1, wherein the output driver comprises a pull-up driver and a pull-down driver which are respectively controlled by a pull-up driving signal and a pull-down driving signal to control the voltage of the I/O pad.

* * * * *